(12) United States Patent
Tuckerman et al.

(10) Patent No.: US 7,566,853 B2
(45) Date of Patent: Jul. 28, 2009

(54) IMAGE SENSOR EMPLOYING A PLURALITY OF PHOTODETECTOR ARRAYS AND/OR REAR-ILLUMINATED ARCHITECTURE

(75) Inventors: David B. Tuckerman, Orinda, CA (US); Kenneth Allen Honer, Santa Clara, CA (US); Bruce M. McWilliams, San Jose, CA (US); Nicholas J. Colella, Pleasanton, CA (US); Charles Liam Goudge, Palo Alto, CA (US)

(73) Assignee: Tessera, Inc., San Jose, CA (US)

( * ) Notice: Subject to any disclaimer, the term of this patent is extended or adjusted under 35 U.S.C. 154(b) by 516 days.

(21) Appl. No.: 11/317,207

(22) Filed: Dec. 23, 2005

(65) Prior Publication Data

US 2007/0034777 A1 Feb. 15, 2007

Related U.S. Application Data

(60) Provisional application No. 60/707,813, filed on Aug. 12, 2005.

(51) Int. Cl.
H01L 27/00 (2006.01)
(52) U.S. Cl. ................................... 250/208.1
(58) Field of Classification Search ............... 250/208.1
See application file for complete search history.

(56) References Cited

U.S. PATENT DOCUMENTS

| 2,507,956 | A | 5/1950 | Bruno |
| 2,796,370 | A | 6/1957 | Ostrander |
| 2,851,385 | A | 9/1958 | Spruance |
| 3,971,065 | A | 7/1976 | Bayer |
| 3,981,023 | A | 9/1976 | King et al. |
| 4,027,323 | A | 5/1977 | Lorenze, Jr. et al. |
| 4,069,095 | A | 1/1978 | Lorenze, Jr. et al. |
| 4,196,508 | A | 4/1980 | Lorenze, Jr. |
| 4,197,633 | A | 4/1980 | Lorenze, Jr. et al. |

(Continued)

FOREIGN PATENT DOCUMENTS

EP 0 490 739 6/1992

(Continued)

OTHER PUBLICATIONS

"Three Dimensional Hybrid Wafer Scale Integration Using the GE High Density Interconnect Technology", by R.J. Wojnarowski, et al., of General Electric Company, Corporate Research & Development, USA, International Conference on Wafer Scale Integration, 1993.

(Continued)

*Primary Examiner*—Seung C Sohn
(74) *Attorney, Agent, or Firm*—Lerner, David, Littenbur, Krumholz & Mentlik, LLP.

(57) ABSTRACT

Image sensors are provided having a plurality of photodetectors in a detector layer Optionally, an optically transparent substrate is provided for a rear-illuminated sensor architecture. The photodetectors may be arranged in three or more arrays. Typically, each array is contiguous and is associated with light of a different color and/or wavelength. In addition, the arrays may be coplanar, or, in the alternative, located at increasing distances from a light-receiving surface in an at least partially nonoverlapping manner. Also provided are image sensor packages.

25 Claims, 9 Drawing Sheets

U.S. PATENT DOCUMENTS

| | | | |
|---|---|---|---|
| 4,259,679 A | 3/1981 | Knibb et al. |
| 4,275,407 A | 6/1981 | Lorenze, Jr. |
| 4,279,690 A | 7/1981 | Dierschke |
| 4,339,689 A | 7/1982 | Yamanaka et al. |
| 4,351,101 A | 9/1982 | Young |
| 4,551,629 A | 11/1985 | Carson et al. |
| 4,764,846 A | 8/1988 | Go |
| 4,794,092 A | 12/1988 | Solomon |
| 4,797,179 A | 1/1989 | Watson et al. |
| 4,862,249 A | 8/1989 | Carlson |
| 4,933,601 A | 6/1990 | Sagawa et al. |
| 4,984,358 A | 1/1991 | Nelson |
| 5,037,779 A | 8/1991 | Whalley et al. |
| 5,081,520 A | 1/1992 | Yoshii et al. |
| 5,104,820 A | 4/1992 | Go et al. |
| 5,118,924 A | 6/1992 | Mehra et al. |
| 5,124,543 A | 6/1992 | Kawashima |
| 5,126,286 A | 6/1992 | Chance |
| 5,177,753 A | 1/1993 | Tanaka |
| 5,250,462 A | 10/1993 | Sasaki et al. |
| 5,266,501 A | 11/1993 | Imai |
| 5,266,833 A | 11/1993 | Capps |
| 5,321,303 A | 6/1994 | Kawahara et al. |
| 5,342,681 A | 8/1994 | Sulzbach |
| 5,393,574 A | 2/1995 | Sulzbach |
| 5,455,386 A | 10/1995 | Brathwaite et al. |
| 5,455,455 A | 10/1995 | Badehi |
| 5,500,540 A | 3/1996 | Jewell et al. |
| 5,526,449 A | 6/1996 | Meade et al. |
| 5,546,654 A | 8/1996 | Wojnarowski et al. |
| 5,547,906 A | 8/1996 | Badehi |
| 5,567,657 A | 10/1996 | Wojnarowski et al. |
| 5,595,930 A | 1/1997 | Baek |
| 5,612,570 A | 3/1997 | Eide et al. |
| 5,657,206 A | 8/1997 | Pedersen et al. |
| 5,661,087 A | 8/1997 | Pedersen et al. |
| 5,672,519 A | 9/1997 | Song et al. |
| 5,675,180 A | 10/1997 | Pedersen et al. |
| 5,677,200 A | 10/1997 | Park et al. |
| 5,703,400 A | 12/1997 | Wojnarowski et al. |
| 5,716,759 A | 2/1998 | Badehi |
| 5,814,894 A | 9/1998 | Igarashi et al. |
| 5,817,541 A | 10/1998 | Averkiou et al. |
| 5,837,562 A | 11/1998 | Cho |
| 5,837,566 A | 11/1998 | Pedersen et al. |
| 5,849,623 A | 12/1998 | Wojnarowski et al. |
| 5,857,858 A | 1/1999 | Gorowitz et al. |
| 5,859,475 A | 1/1999 | Freyman et al. |
| 5,869,353 A | 2/1999 | Levy et al. |
| 5,888,884 A | 3/1999 | Wojnarowski |
| 5,891,761 A | 4/1999 | Vindasius et al. |
| 5,900,674 A | 5/1999 | Wojnarowski et al. |
| 5,909,052 A | 6/1999 | Ohta et al. |
| 5,938,452 A | 8/1999 | Wojnarowski |
| 5,952,712 A | 9/1999 | Ikuina et al. |
| 5,965,933 A | 10/1999 | Young et al. |
| 5,985,695 A | 11/1999 | Freyman et al. |
| 5,986,746 A | 11/1999 | Metz et al. |
| 5,993,981 A | 11/1999 | Askinazi et al. |
| 6,002,163 A | 12/1999 | Wojnarowski |
| 6,020,217 A | 2/2000 | Kuisl et al. |
| 6,022,758 A | 2/2000 | Badehi |
| 6,040,235 A | 3/2000 | Badehi |
| 6,046,410 A | 4/2000 | Wojnarowski et al. |
| 6,072,236 A | 6/2000 | Akram et al. |
| 6,080,596 A | 6/2000 | Vindasius et al. |
| 6,083,766 A | 7/2000 | Chen |
| 6,087,586 A | 7/2000 | Chen |
| 6,092,280 A | 7/2000 | Wojnarowski |
| 6,098,278 A | 8/2000 | Vindasius et al. |
| 6,106,735 A | 8/2000 | Kurle et al. |
| 6,124,637 A | 9/2000 | Freyman et al. |
| 6,134,118 A | 10/2000 | Pedersen et al. |
| 6,235,141 B1 | 5/2001 | Feldman et al. |
| 6,307,261 B1 | 10/2001 | Val et al. |
| 6,329,708 B1 | 12/2001 | Komiyama et al. |
| 6,590,291 B2 | 7/2003 | Akagawa et al. |
| 6,646,289 B1 | 11/2003 | Badehi et al. |
| 6,891,256 B2 | 5/2005 | Joshi et al. |
| 6,977,431 B1 | 12/2005 | Oh et al. |
| 7,033,664 B2 | 4/2006 | Zilber et al. |
| 7,425,460 B2 * | 9/2008 | Pain .................... 257/E33.068 |
| 2005/0074954 A1 | 4/2005 | Yamanaka |

FOREIGN PATENT DOCUMENTS

| | | |
|---|---|---|
| EP | 0 650 199 | 4/1995 |
| EP | 0 790 653 A2 | 8/1997 |
| EP | 0 810 659 A2 | 12/1997 |
| JP | 63-166710 | 7/1988 |
| JP | 11-326366 | 11/1999 |
| WO | WO-85/02283 | 5/1985 |
| WO | WO-89/04113 | 5/1989 |
| WO | WO-95/19645 | 7/1995 |

OTHER PUBLICATIONS

"M-DENSUS", Dense-Pac Microsystems, Inc., Semiconductor International, Dec. 1997, p. 50.

"Introduction to Cubic Memory, Inc.", Cubic Memory Incorporated, 27 Janis Way, Scotts Valley, CA. 95066, USA.

"Memory Modules Increase Density", DensPac Microsystems, Garden Grove, CA, USA, Electronics Packaging and Production, p. 24, Nov. 1994.

"Four Semiconductor Manufactures Agree to Unified Specifications for Stacked Chip Scale Packages", Mitsubishi Semiconductors, Mitsubishi Electronics America, Inc., 1050 East Arques Avenue, Sunnyvale, CA, USA.

Wolf, J,"High Density Packaging: The Next Interconnect Challenge", Semiconductor International, Feb. 2000, pp. 91-100.

"Front-End 3-D Packaging", J. Baliga, Semiconductor International, Dec. 1999, p. 52.

"3-D IC Packaging", Semiconductor International, p. 20, May 1998.

Dance, Brian,"First Three-Chip Staked CSP Developed", Semiconductor International, Jan. 2000, p. 22.

"High Density Pixel Detector Module Using Flip Chip and Thin Film Technology" J. Wolf, P. Gerlach, E. Beyne, M. Topper, L. Dietrich, K.H. Becks, N. Wermes, O. Ehrmann and H. Reichl, International System Packaging Symposium, Jan. 1999, San Diego.

Fan, A. Rahman and R. Reif. "Copper Wafer Bonding", Electrochemical and Solid-State Letters 2(10) 534-536 (1999).

* cited by examiner

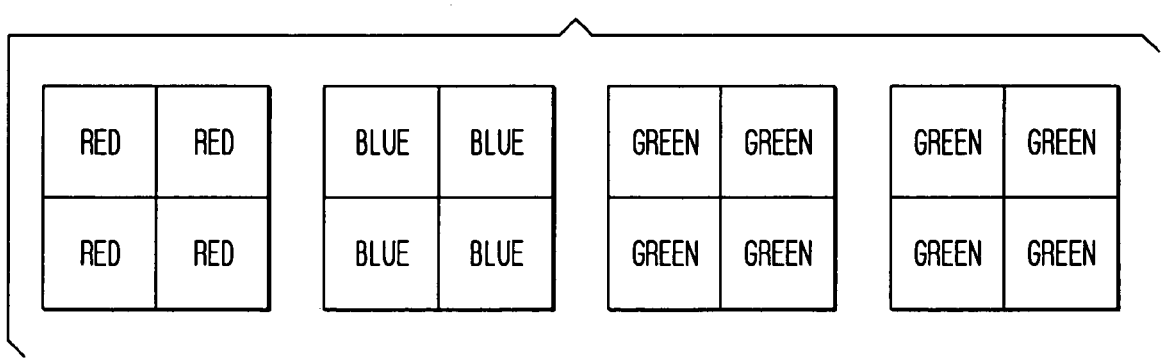

CENTER PIXEL RED= C22- 1/2 (C12+C21)
CENTER PIXEL GREEN= 1/2 (C12+C21)
CENTER PIXEL BLUE= C11

IMAGE SENSOR EMPLOYING A PLURALITY OF PHOTODETECTOR ARRAYS AND/OR REAR-ILLUMINATED ARCHITECTURE

CROSS-REFERENCE TO RELATED APPLICATIONS

The present application claims the benefit of the filing date of U.S. Provisional Patent Application No. 60/707,813, filed Aug. 12, 2005, the disclosure of which is hereby incorporated by reference herein.

FIELD OF THE INVENTION

The invention relates generally to images sensors. In particular, the invention relates to image sensors that employ a rear-illuminated architecture and/or a plurality of contiguous photodetector arrays. Also provided are image sensor packages.

BACKGROUND OF THE INVENTION

Microelectronic devices such as semiconductor chips are flat bodies having opposing front and rear surfaces. Contacts on either or both surfaces are typically connected to the internal electrical circuitry of the chip itself. Microelectronic devices have become ubiquitous in various consumer product markets, portable or otherwise, due to their size and functionality. For example, microelectronic devices have been employed in optical and imaging applications.

A number of microelectronic technologies are available for use in image sensing applications. For example, complementary metal-oxide semiconductors (CMOS) and charge-coupled device (CCD) technologies have been used in conventional image sensors, which have been incorporated into products such as digital camera and cellular telephones. Such image sensing microelectronic devices are typically illuminated from their front surface, e.g., the front surface of an image sensing chip.

FIG. 1, for instance, schematically depicts a known image sensor architecture for a CCD camera. A microelectronic device 10 is provided having parallel opposing front and rear surface, indicated at 12 and 14, respectively. An array of photodetectors 22 is provided on the front surface 12. Each photodetector 22 may be associated with a microlens 30 to improve its sensitivity. Also provided are color filters 40 that allow for the selective transmission of light of a particular wavelength toward the photodetectors 22. A camera lens 50 is placed over the array at a distance selected according to the area of the photodetector array and the focal length of the lens. In operation, light is transmitted through the camera lens 50, the microlenses 30, and the filters 40, thereby impinging on the photodetectors 22 on the front device surface 12. Accordingly, the image sensor architecture depicted in FIG. 1 is known as a front-illuminated architecture.

One problem with the sensor architecture of FIG. 1 is that the microlenses are typically formed from a polymeric material onto which dust and other particular matter may adhere. Once such matter adheres to a microlens, the performance of the photodetector associated therewith is compromised. Thus, such sensors must be handled in a substantially dust-free environment (e.g., a cleanroom) when the microlenses are exposed. Only after the microlenses are protected can an image sensor be removed from the substantially dust-free environment.

Thus, for the sensor architecture described above as well as other applications, microelectronic devices may require a protective element, e.g., a cover over all or part of the front surface. As alluded to above, certain electro-optical chips such as optical sensing chips and light-emitting chips have photosensitive elements which must be protected by a cover. Optionally, a cavity may be formed between the protective element and the front device surface. Other chips requiring a protective element include, for example, surface acoustic wave or "SAW" chips, microelectromechanical systems or "MEMS" chips (see, e.g., U.S. Pat. No. 5,610,431 to Martin), and chips that employ voltage controlled oscillators (VCOs).

In some instances, optical devices such as image sensors can be made in the form of a unitary wafer, optionally undergo wafer-scale packaging, and be severed to form individual units. This may be done to improve productivity and reduce costs associated with microelectronic manufacturing. For example, U.S. Published Patent Application No. 2005/0095835, entitled "STRUCTURE AND METHOD OF MAKING CAPPED CHIPS HAVING VERTICAL INTERCONNECTS," filed Sep. 24, 2004, inventors Humpston, Tuckerman, McWilliams, Haba, and Mitchell, describes wafer-level methods for producing capped chips. The capped chips have electrical interconnects made from elements that extend from contacts of a chip at least partially through a plurality of through holes of a cap. The electrical interconnects may be solid, so as to form seals extending across the through holes. In some cases, stud bumps extend from the contacts, forming parts of the electrical interconnects. In some cases, a fusible conductive medium forms a part of the electrical interconnects.

Nevertheless, there are some unavoidable drawbacks associated with the use of a cover in image sensor technology. For example, there is the cost associated with the manufacture of the cover as well as the cost associated with placement and/or alignment of the cover relative to the microelectronic device. Furthermore, when the cover is made from a material that has a coefficient of thermal expansion (CTE) that differs from that of the microelectronic device, problems associated with the CTE mismatch between the cover and the device must be resolved.

Accordingly, opportunities exist in the art to provide alternatives and improvements to the image sensor architectures. In particular, it has been discovered that rear-illuminated architectures may be advantageously employed to overcome the drawbacks of known image sensor technologies. Furthermore, it has been discovered that architectures employing a plurality of contiguous photodetector arrays may also be advantageously used in conjunction with or as an alternative to rear-illuminated architectures.

SUMMARY OF THE INVENTION

In general, the invention provides image sensors. In a first embodiment, a sensor is provided that includes an optically transparent substrate having first and second opposing surfaces, a detector layer in contact with the second surface, a plurality of photodetectors, and one or more color filters. The first surface is a light-receiving surface. The photodetectors are located at sites of first, second, and third arrays in the detector layer. The one or more color filters are positioned to allow for selective transmission of light of first, second, and third wavelengths through the substrate to first, second, and third arrays, respectively. This embodiment is particularly suited for a sensor architecture that does not employ any microlenses.

In another embodiment, an image sensor is provided comprising a detector layer, first, second, and third arrays of photodetectors, and first, second, and third lenses. The arrays are each contiguous, located in the detector layer, and substantially coplanar to each other. The lenses are effective to direct transmission of light to their respective photodetector arrays.

In still another embodiment, an image sensor is provided comprising a detector layer containing first, second, and third contiguous arrays of photodetectors therein and having a light-receiving surface. The arrays are located in the layer at increasing distances from the light-receiving surface. In addition, at least a portion of each array does not overlap another.

For any of the sensors of the invention, the substrate, when used, is typically made from an insulating material. In some instances, a ceramic material may be used. When optical transparency is desired, exemplary suitable ceramic materials include oxides such as silicon oxides and aluminum oxides. Such oxides may be single crystalline, multicrystalline, or amorphous.

In addition, detectors of the invention are typically located in a detector layer comprising a semiconductor material. While the semiconductor material may consist of or comprise Si, other semiconductor materials may be used as well.

As alluded to above, different embodiments of the invention may have different arrangements of photodetectors. Typically, the photodetectors are arranged in at least one array. However, any number of photodetector arrays may be used. In any case, optimal sensor performance may result when arrays are provided in a nonzero positive integer multiples of three, four, or five.

When a plurality of arrays is employed, the arrays may be contiguous or noncontiguous, coplanar or noncoplanar. As an initial matter, any sensor that employs a plurality of arrays may involve the arrangement of the arrays in a linear pattern. In addition, depending on the number of arrays used, the arrays may be arranged in different patterns. For example, three coplanar arrays may be arranged in a triangle pattern. Four coplanar arrays may be are arranged in a quadrilateral pattern. Five coplanar arrays may be arranged in a cross pattern.

Each array typically corresponds to a wavelength of light or color. For example, when three arrays are provided, the arrays may each correspond to a different one of red, green, and blue. When a fourth array is added, the array may correspond to a different color, e.g., white, or the same color as one of the aforementioned, e.g., red, green, or red.

The invention also provides an image sensor package that includes any of the image sensors described above. The package includes a plurality of electrical contacts in electrical communication with the photodetectors. The contacts may be movable relative to the photodetectors, preferably in a sufficiently stress-relieving manner so as to maintain electrical communication with the photodetectors under repeated thermal cycling and other conditions.

BRIEF DESCRIPTION OF THE DRAWINGS

FIG. 3 depicts a pixel array formed from color filters arranged in a "Bayer pattern" over sixteen photodetectors situated at sites of a square rectilinear array.

FIG. 4 depicts four pixel arrays of different colors formed from a rearrangement of the pixels shown in FIG. 3.

FIG. 7A schematically depicts in plan view a Bayer pattern with color filters. FIG. 7B schematically depicts in plan view a modified Bayer pattern in which color detection is based on depth of penetration, respectively. FIGS. 7C and 7D depict, in side view, different arrangements of photodetectors at different depths relative to a light receiving surface.

FIG. 9A depicts three arrays arranged in a line. FIG. 9B depicts four differently colored arrays in a line. FIG. 9C depicts four arrays in a line that comport to the color proportionality of a Bayer pattern. FIG. 9D depicts four arrays in a square pattern that comport to the color proportionality of a Bayer pattern.

FIG. 10A depicts five pixel arrays in a line having mirror color symmetry. FIG. 10B depicts five pixel arrays in a cross pattern having mirror color symmetry.

FIG. 11A depicts an exemplary arrangement of a light circle and a pixel array that avoids the vignetting phenomenon. FIG. 11B depicts an exemplary arrangement of a plurality of light circles and a plurality of spaced-apart pixel arrays. FIG. 11C depicts in side view a plurality of spaced-apart pixel arrays relative to their light-circle generating lenses. FIG. 11D depicts in side view a plurality of pixel arrays separated by absorptive vertical walls instead of being spaced apart.

DETAILED DESCRIPTION

Before describing the present invention in detail, it is to be understood that the invention is not limited to specific photodetector technologies or types of electronic products, as such may vary. It is also to be understood that the terminology used herein is for the purpose of describing particular embodiments only, and is not intended to be limiting.

As used in this specification and the appended claims, the singular article forms "a," "an," and "the" include both singular and plural referents unless the context clearly dictates otherwise. Thus, for example, reference to "an array," includes a plurality of arrays as well as a single array, reference to "a wavelength" includes a single wavelength as well as a range of wavelengths, and the like.

In addition, terminology indicative or suggestive of a particular spatial relationship between elements of the invention is to be construed in a relative sense rather an absolute sense unless the context of usage clearly dictates to the contrary. For example, the terms "over" and "on" as used to describe the spatial orientation of a sensor relative to a carrier or contacts does not necessarily indicate that the sensor is located above the carrier or contacts. Thus, in a package that includes a sensor placed over or on a carrier and contacts, the sensor may be located above, at the same level as, or below, the carrier and contacts depending on the package's orientation.

Thus, in a first aspect, the invention pertains to an image sensor having a rear-illuminated architecture. Typically, such a sensor includes an optically transparent substrate having first and second opposing surfaces, a detector layer in contact with the second surface, and a plurality of photodetectors. In such a case, the first surface is a light-receiving surface, and the photodetectors are located in the detector layer.

Figure 2:
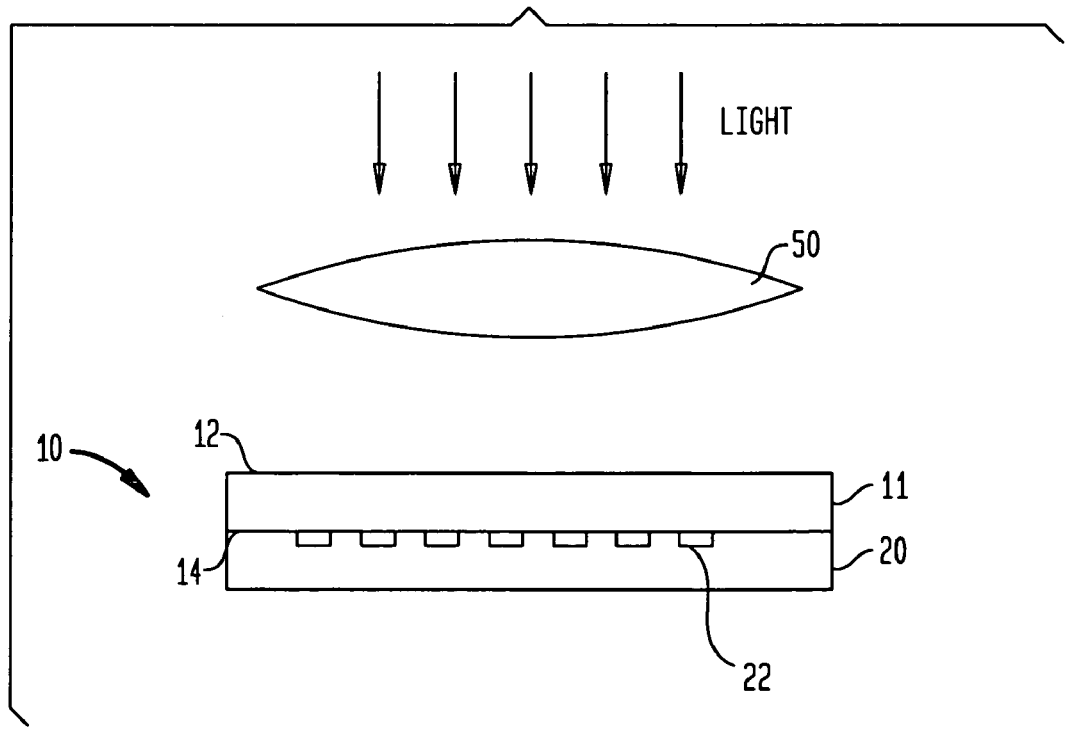
FIG. 2 schematically depicts an images sensor for a CCD camera that employs a rear-illuminated architecture.

A simple example of such a sensor architecture for a camera is shown in FIG. 2. As is the case with all figures referenced herein, in which like parts are referenced by like numerals, FIG. 2 is not necessarily to scale, and certain dimensions may be exaggerated for clarity of presentation. A microelectronic device 10 is provided comprising an optically transparent substrate 11 and a detector layer 20. The substrate has parallel opposing front and rear surface, indicated at 12 and 14, respectively. The front surface 12 is considered a light-receiving surface, and the detector layer 20 is positioned in contact with the rear surface 14. A plurality of photodetectors 22 is provided in the detector layer 20. In addition, no microlenses are provided. Nevertheless, a camera lens 50 is placed over the array at a distance from the photodetectors 22. In operation, light is transmitted through the camera lens 50, the light-receiving surface 12 of the substrate, the interior of the substrate 11, and the opposing surface 14 of the substrate, thereby impinging on the photodetectors 22 in the detector layer 20.

In general, any of a number of materials may be used to form the transparent substrate. For example, a number of ceramic materials are optically transparent. The term "ceramic" is generally used herein in its ordinary sense to indicate to a hard, brittle, heat-resistant and corrosion-resistant dielectric material made typically made by heating an inorganic compound, e.g., single or mixed metal oxides such as aluminum, zirconium or silicon oxides, nitrides, and carbides, at a high temperature. A ceramic material may be single crystalline, multicrystalline, or, as in the case of glass, amorphous.

In particular, certain oxides have superior optical properties for use with the invention. Exemplary oxides for use in the invention include silicon oxides (e.g., quartz or silicon-based glass) and aluminum oxides (e.g., sapphire). As discussed in detail below, these materials may be used with existing image-sensor processes, particularly those that involve the application of heat.

The rear-illuminated architecture provides a number of advantages over the art. For example, when photodiodes are illuminated from the backside, there are no concerns with metal traces blocking the signal. In addition, the fill factor is larger. As discussed in detail below, increasing the fill factor decreases the need for microlenses and saves cost.

In another aspect, the invention pertains to an image sensor that employs a plurality of photodetectors in a plurality of contiguous arrays. The term "array" is used herein in its ordinary sense and refers to a two-dimensional arrangement of features such as an arrangement of photodetectors, filters, or lenses. Arrays are generally comprised of regular, ordered features, as in, for example, a rectilinear grid, parallel stripes, spirals, and the like. An "array" differs from a "pattern" in that "patterns" do not necessarily contain regular and ordered features. In addition, the term "contiguous array" is to an array in which features are uninterrupted. For example, contiguous array of a single first color generally should not contain any feature of another color between any two adjacent features of the first color. Thus, an array containing only red pixels uninterrupted by pixels of another color may be considered a contiguous array. In contrast, while a two-dimensional Bayer pattern of color pixels may be considered to include three coplanar arrays, i.e., a red pixel array, a green pixel array, and a blue pixel array, none of the three arrays may be considered "contiguous," because the pixels of each color array is interrupted by interspersed pixels of the other two colors. Accordingly, two contiguous and coplanar arrays of features will not have any overlapping portions except, in certain instances, at their edges and/or corners.

Typically, photodetector arrays are located in a detector layer. In some instances, the arrays are coplanar to each other. In the alternative, the arrays may be located at increasing distances from a light-receiving surface of the image sensor. In any case, a sensor that incorporation this aspect of the invention typically, in contrast to those described in U.S. Pat. No. 6,632,701 to Merrill, include arrays located such that at least a portion of each array does not overlap another. In addition, the arrays may be substantially identical to or different from each other. For example, they may have the same or different number of photodetectors.

The detector layer may be provided in the form of a chip, wafer, or a portion thereof. In addition, the detector layer may be constructed from any material that does not interfere with the operation of the photodetectors. For example, photodetectors may take the form of photodiodes or photogates. The material may be selected according to the form of the photodetectors.

In any case, the detector layer typically includes a semiconductor material. The term "semiconductor" is used herein in its ordinary sense to indicate any of various solid crystalline substances having electrical conductivity greater than insulators but less than good conductors. For example, detector layers of the invention may include a single crystalline material consisting essentially of a single element, e.g., Si or Ge, or a compound semiconductor, e.g., a III-V semiconductor such as GaAs. The presence or absence of dopants is not critical to the invention, except when operability of the invention is in question. Alternatively, a multicrystalline or amorphous semiconductor material may be used. The invention may be advantageously employed in conjunction with technologies that employ either direct or indirect band gap semiconductors.

As the processing infrastructure for silicon is generally more robust than that of other semiconductors, silicon-based detector layers are often preferred regardless of the architecture of the image sensor. For example, silicon-based detector layers may be advantageously used in both front-illuminated and rear-illuminated sensor architectures. With the rear-illuminated sensor architecture, however, certain optically transparent substrate materials are preferred when a silicon-based detector layer is used. For example, rear illuminated sensors may be formed from silicon-on-insulator (SOI) wafers. Exemplary silicon-on-insulator systems include silicon-on-quartz (SOQ), silicon-on-glass (SOG) and silicon-on sapphire (SOS). It is expected that SOQ systems may be particularly suited for use with the invention because it permits standard high-temperature processing techniques involving, for example, thermal oxidation, diffusion, etc. As a result, substantial changes would not be required to existing image-sensor processes.

Other features of the invention also relate to image sensors. For sensors that employ a plurality of photodetector arrays, one or more color filters may be positioned in a manner effective to allow selective transmission of light of particular wavelengths to each array. In addition or in the alternative, a plurality of lenses may be positioned in a manner effective to direct transmission of light to each array. Thus, an image sensor having first, second, and third photodetector arrays may employ: (a) one or more color filters positioned in a manner effective to allow selective transmission of light of first, second, and third wavelengths through the substrate to the first, second, and third arrays, respectively; and/or (b) first, second, and third lenses positioned in a manner effective to direct transmission of light to the first, second, and third arrays, respectively.

To illustrate the how color filters and or lenses may be advantageously used with the invention, the following provides some background on known image sensor architectures. In general, known color image sensor architectures use one or more color filters over an array of photodetectors. The filters serve to block photos with wavelengths other than a wavelength (or range of wavelengths) of interest, allow the remaining photons to be collected by the underlying photodetectors. The color filter or filters are often arranged in a "Bayer pattern." See, e.g., U.S. Pat. No. 3,971,065 to Bayer. An exemplary pixel array is having color filters arranged in a "Bayer pattern" is depicted in FIG. 3. As shown, a four-by-four square array of green, red and blue filters provided that are of substantially identical size and shape. Each filter is located over a different photosensor. It should be apparent, then, that sixteen photosensors (not shown) are also arranged in a four-by-four array under the filters.

Each row of the array contains filters of alternating colors. That is, each row contains alternating red and green filters or alternating green and blue filters. Similarly, each column contains filters of alternative colors. No two neighboring filters in a row or in a column share the same color. Green filters occupy half of all array sites, while red and blue filters each occupy a quarter of all array sites.

Figure 1:
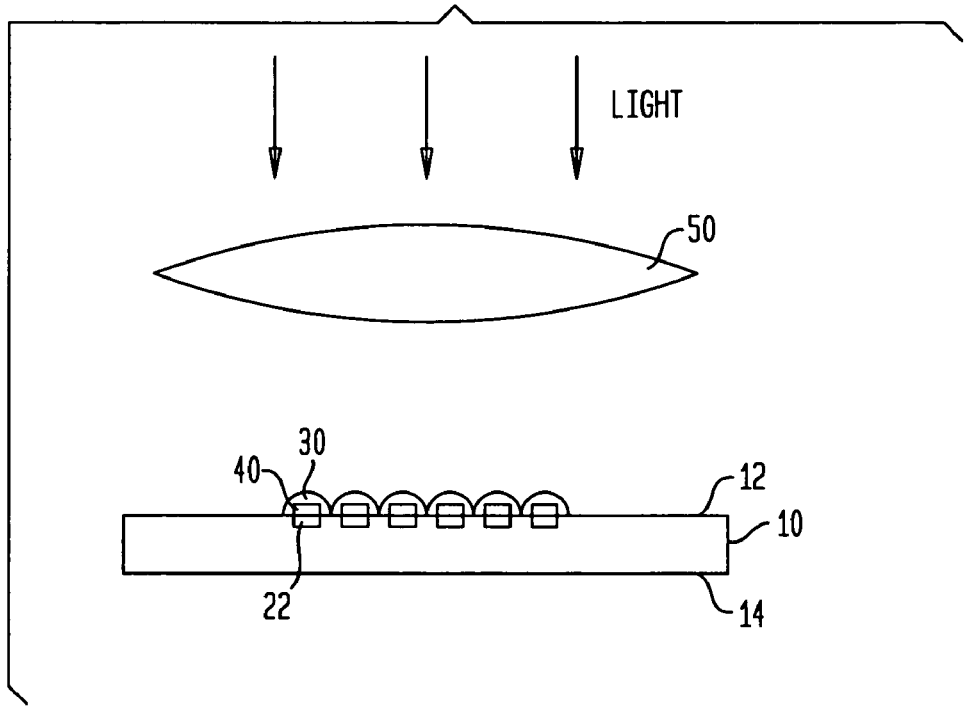
FIG. 1 schematically depicts an image sensor for a CCD camera that employs a known front-illuminated architecture.

Unlike the image sensors of the invention, certain known color image sensors require a plurality of microlenses. Typically, each photodetector requires its own microlens. In addition, as suggested by FIG. 1 and the accompanying text, the presence of microlenses do not eliminate the need for a larger imaging lens. Relative to the sensors that use the inventive sensor architecture, the use of color filters in a "Bayer pattern" and microlenses generally adds complexity and cost to images sensors.

In addition, microlenses are also problematic for additional reasons. In general, microlenses work for light coming in at close to normal incidence only. Light at the corners may be coming in at an angle to the sensor and be lost, resulting in darkness or vignetting (as discussed below). Microlenses also tend to be relatively soft and easily damaged. Thus, it is very hard to remove dust from the image sensor. By removing the microlenses from the sensor, the sensitivity and durability of the sensor is increased. Furthermore, microlenses are also implicated in causing purple fringe, an artifact common in digital imaging systems. It has been theorized that purple fringes are caused by chromatic aberration of the microlenses, particularly for light coming in off normal.

In contrast, some embodiments of the invention include an architecture that employs a plurality of contiguous pixel array. For example, the sixteen pixels of FIG. 3 may be alternatively be arranged so that they form four substantially coplanar contiguous two-by-two arrays, as shown in FIG. 4. It should be noted that the term "substantially" as used to describe the term "coplanar" as "in substantially coplanar" refers to the considerable degree to which items are in the same plane. Similarly, the terms "substantial" and "substantially" are used analogously in other contexts involve an analogous definition.

As shown in FIG. 4, each array contains pixels of a single color. As a result, one red two-by-two array, one blue two-by-two array, and two green two-by-two arrays are formed. That is, instead of employing the Bayer pattern of color filters, each two-by-two array employs one or more filters of the same color. It should be apparent that the color filter arrangement shown in FIG. 4 is simpler and less expensive to produce than the color filter layout shown in FIG. 3.

Figure 5:
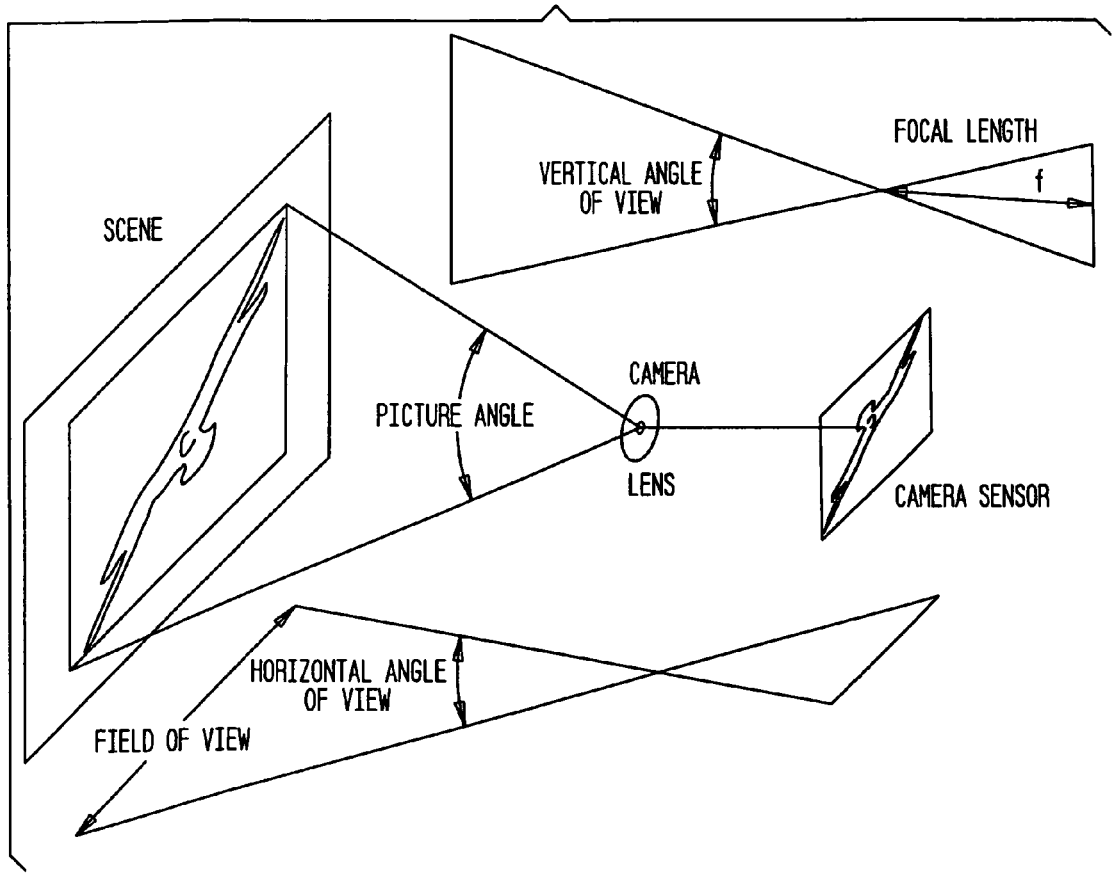
FIG. 5 shows the geometric interrelationship between a detector array, a camera lens having a focal length (f), and a field of view for a sensor.

It should be noted that array based image sensors for cameras generally require a camera lens for each photodetector array. As shown in FIG. 5, the camera lens for each array should have a focal length equal to the lateral dimension of the photodetector array divided by the desired field of view angle. Otherwise, detectors may not be exposed to incoming light or incoming light will not impinge on a pixel.

Figure 6A:
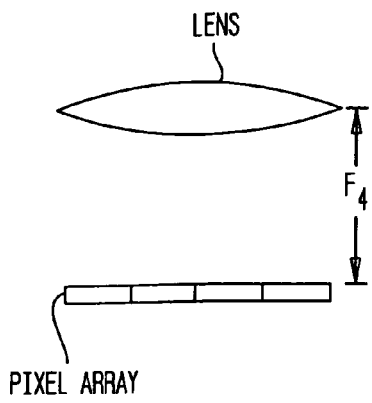
FIGS. 6A and 6B, collectively referred to as FIG. 6, depict in side view sensor architectures using the pixel arrays of FIGS. 3 and 4, respectively.
Figure 6B:
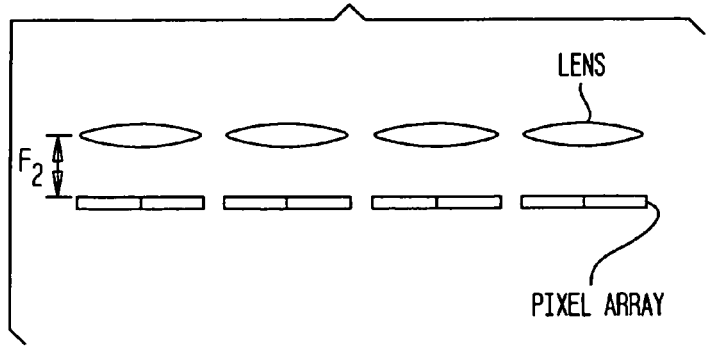

As a result of the above-described optical considerations with respect to the focal length of the camera lens relative to its phototodetector array, image sensor architectures that employ a plurality of contiguous pixels arrays may exhibit form factor advantages over prior art architectures. For example, FIG. 6 depicts in side view the pixels arrays of FIGS. 3 and 4, each array associated with its own camera lens. As described above, the pixels array of FIGS. 3 and 6A includes a single four-by-four matrix, while each pixel array of FIGS. 4 6B includes four individual two-by-two matrix. Thus, the lateral dimension of the four-by-four pixel array is twice that of any one of the lateral dimension of the two-by-two pixel arrays. Accordingly, the focal length (F4) of the lens for the four-by-four pixel array should be twice the focal length (F2) of any of the lenses for each of the two-by-two pixel arrays. It follows, then, the image sensor architecture associated with a Bayer pattern sensor may require a height that is at least about twice needed for the image sensor architecture that includes a plurality of arrays.

As discussed above, when a plurality of contiguous arrays of photodetectors are provided in a detector layer, each array may employ a different lens positioned in a manner effective to direct transmission of light thereto. When each array is single color pixel array, the associated lens may be required to handle a subset of the visible wavelength range. Accordingly, the chromatic requirements on the lens are relaxed. The lenses for each different color can be optimized to work best with that particular color. The relaxed wavelength requirements also reduce lens complexity and lead to lower cost.

Lenses for use with the invention may be formed from any of materials that exhibit the appropriate optical properties for the intended application. For example, the material must be transparent to optical radiation at wavelengths keyed to the sensitivity of the sensor. In some instances, a lens may be formed from a ceramic material as described above and/or a polymeric material. The terms "polymer" or "polymeric" are used herein in their ordinary sense to refer to any of numerous natural and synthetic compounds of usually high molecular weight formed from a plurality of monomeric units, each typically having a low molecular weight. The terms include, for example, homopolymers as well copolymers, linear as well as branch and/or cyclic polymers, crosslinked as well as uncrosslinked polymers. Exemplary polymers suitable for use in the invention include those known in the microelectronic packaging industry such as those containing cyclic moieties, e.g., polycarbonates, polyimides, polyethylene terephthalates, and polystyrenes. In addition, polymer families such as polyarylene ethers, polyarylenes, and parylenes may be used as well. In some instances, halogenated polymers may be used. Exemplary commercially available fluorinated and/or chlorinated polymers include polyvinylchloride, polyvinylfluoride, polyvinylidene fluoride, polyvinylidene chloride, polychorotrifluoroethylene, polytetrafluoroethylene, polyhexafluoropropylene, and copolymers thereof.

When a plurality of lenses is used, the lenses may be formed individually or together. For example, three to five lenses could be implemented in one piece of injection molded polymer. Alternatively, the lenses could be written as a pattern in the interior of a single glass sheet otherwise. The lenses may also be made from etched glass. Both wet or dry etch techniques known in the art may be used to form the lenses of the invention. Similarly, techniques that use resist reflow or gray scale lithography may be used as well.

Color filters, when employed with the invention, may be provided in any of number of forms. In some instances, color filters may be provided on-chip, e.g., as an integral part of a chip or wafer that contains detector layer. In the alternative, moving the color filters off-chip or off-wafer has advantages as well. For example, wafer cost may be reduced by moving color filters off-chip. In addition, off-chip manufacturing of bulk filter provides greater precision and performance from a manufacturing perspective.

Figure 7A:
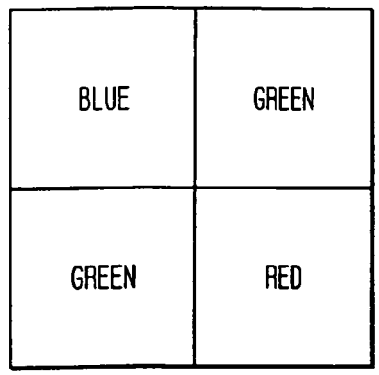
FIGS. 7A-7D, collectively referred to as FIG. 7, depict different arrangement of pixels.
Figure 7B:
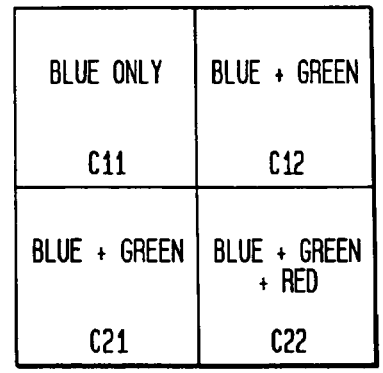
Figure 7C:
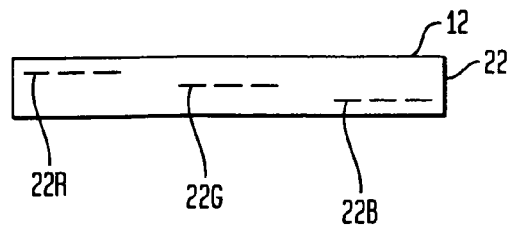
Figure 7D:
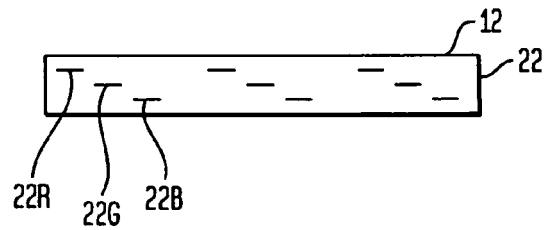

However, the color filters are not a requirement of the invention. In some instances, the invention, as an alternative to using color filters, takes advantage of the differential penetrative properties of photons of different wavelengths relative to the detector layer. For example, photons of different wavelengths penetrate silicon to different depths. Exploitation of this phenomenon has been described in U.S. Pat. No. 6,632,701 to Merrill. However, the present invention, unlike the technologies described in the '701 patent, does not require different color sensors to be stacked on top of each other. In some instances, all feature of an array may be located at a single depth. Alternatively, each array may be, for example, the different depth photodiodes could be arranged in a modified Bayer-Pattern as shown in FIG. 7. FIG. 7A depicts a typical Bayer pattern with color filters. FIG. 7B depicts an architecture similar to that of FIG. 7A except that it employs a modified Bayer pattern based on depth of penetration. As shown in FIG. 7B, the blue pixel has the shallowest junction depth and the all color pixel has the deepest. FIGS. 7C and 7D depict in side view different arrangements of photodetectors 22R, 22G, 22B at different depths of a detector layer 22 to a light receiving-surface 12. In FIG. 7C, no array overlaps another. In FIG. 7D, each array overlaps another, but the photodetectors 22R, 22G, 22B are arranged in a staggered manner such that no photodetector overlaps another. In any case, the photodetectors may be arranged according to the depth of penetration for the wavelength of light to be detected.

Figure 8:
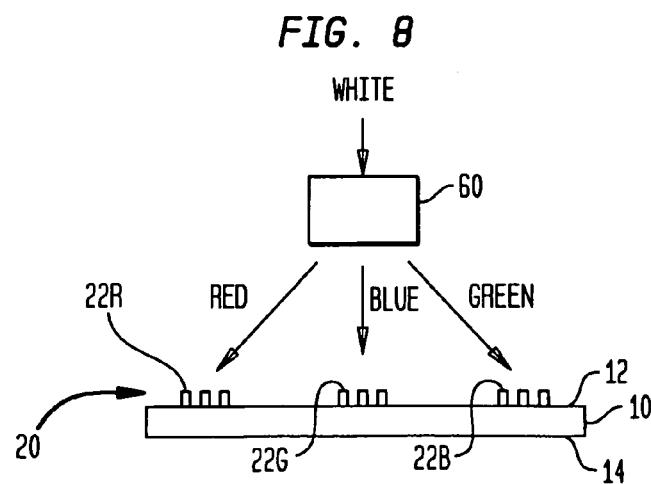
FIG. 8 depicts an image sensor that employs prism-based technology to split incoming light into light of different colors and directs the differently colored light to their respective arrays.

As an alternative or as an additional aspect of the invention to architectures that employ color filters and/or exploit differential penetrative properties of different colored light, the invention may use a prism. Prisms are often used to separate light having a plurality of wavelengths (e.g., white light) into its constituent wavelengths. FIG. 8 depicts an image sensor that employs a prism-based to split incoming light into light to different wavelengths. The sensor includes a microelectronic device 10 is provided having parallel opposing front and rear surface, indicated at 12 and 14, respectively. Three arrays of photodetectors 22R, 22G, 22B are provided on in a detector layer 20 on the front surface 12. Also provided is a light-splitting set-up 60 that separates incoming light into its component wavelengths. Photodetectors 22R are placed in a contiguous array that is positioned to receive red light from the set-up 60. Similarly, photodetectors 22G and 22B are placed in contiguous arrays positioned to receive green and blue light, respectively. Those of ordinary skill in the art will recognize that such light-splitting set-ups may include one or more mirrors, grating, filters, prisms, etc.

FIG. 9 depicts how the various pixel arrays can be arranged in a number of different ways. As shown in FIG. 9A, three arrays may be arranged in a line with three different color filters or three different junction depths. As shown in FIGS. 9B-9D, four arrays may be employed as well. As shown in FIG. 9B, the fourth array may be used to detect all colors (with better low light performance, but saturation at higher light levels), all colors attenuated (to match the sensitivity of the other sensors). As shown in FIGS. 9C and 9D, the fourth array may be used to detect green, so that the pixels of all arrays comport to the color proportionality of a Bayer pattern.

Figure 10A:
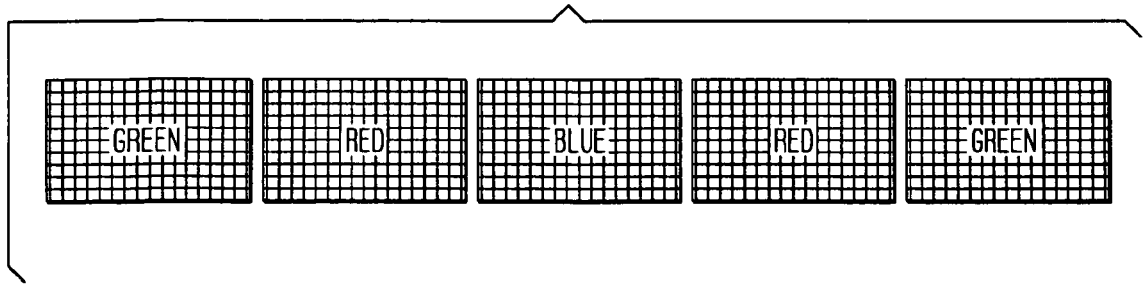
FIGS. 10A and 10B, collectively referred to as FIG. 10, depict various arrangements of five pixel arrays.
Figure 10B:
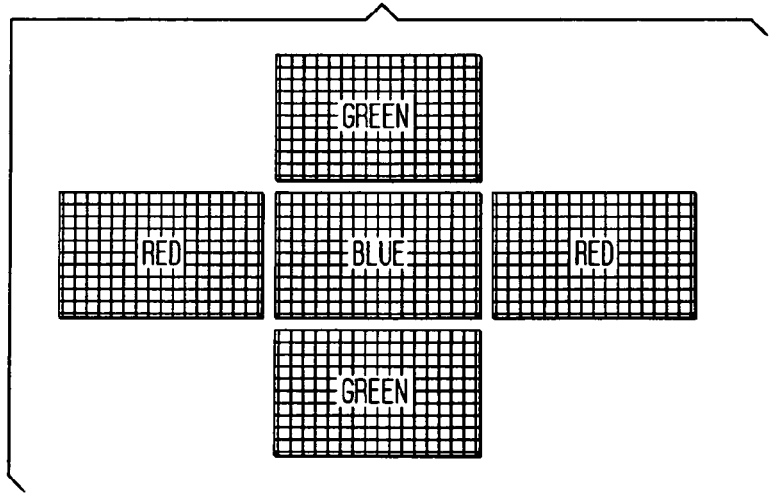

For the three or four array image sensors, some sections of an image may contain objects both close to and far from the camera lenses that include wavelengths covered by only one or two of the arrays. The information associated with the additional color wavelengths may have to be estimated in some way from adjacent pixels. One way to avoid problems with missing color information due to parallax is to use a symmetric pixel array as shown in FIG. 10. For example, FIG. 10A depicts a five pixel arrays arranged in a line. FIG. 10B shows five pixel arrays arranged in a cross.

For image sensors containing five pixel arrays, the blue array may not be duplicated. Blue light has the highest quantum efficiency in photodetectors such as photodiodes because it is of higher energy than either green or red light. Furthermore, the human eye is the least sensitive to blue light as can be seen by the formula for luminance, which is based on average human vision, below:

LUMINANCE=0.299*RED+0.587*GREEN+
0.114*BLUE

Thus, color accuracy of blue light is typically the least important. The two red and green arrays serve to reduce the overall errors in magnitude versus having only single arrays for those colors.

Figure 9A:
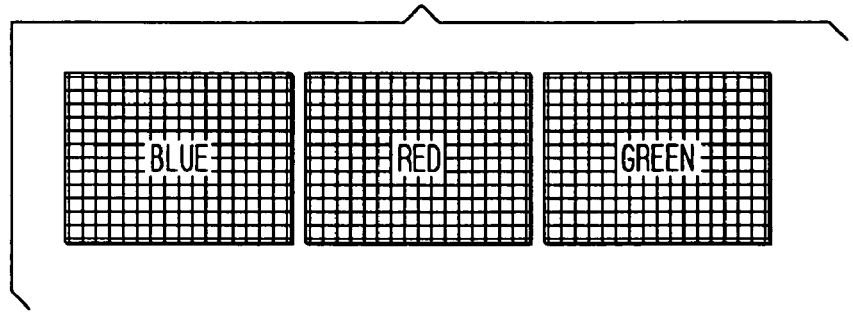
FIGS. 9A-9D, collectively referred to as FIG. 9, depict various arrangements of pixel arrays.
Figure 9B:
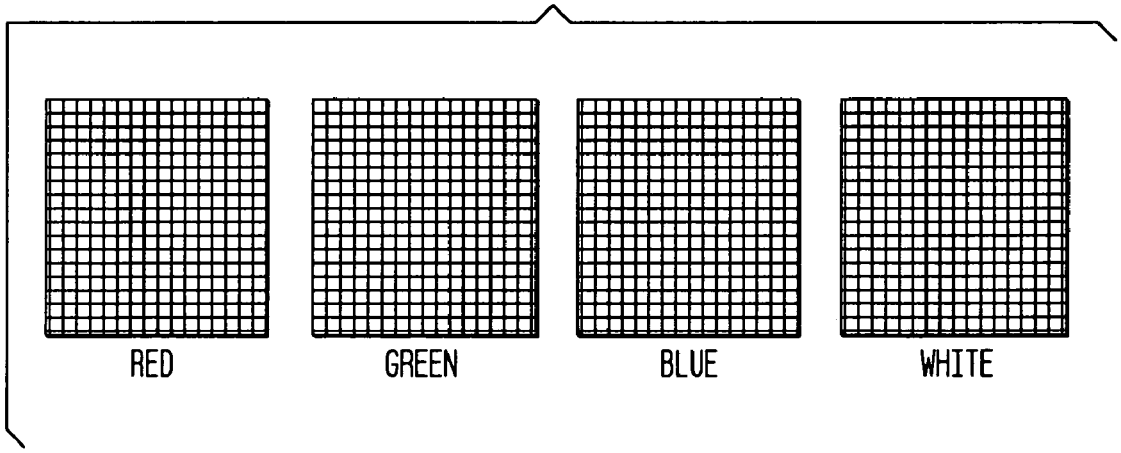
Figure 9C:
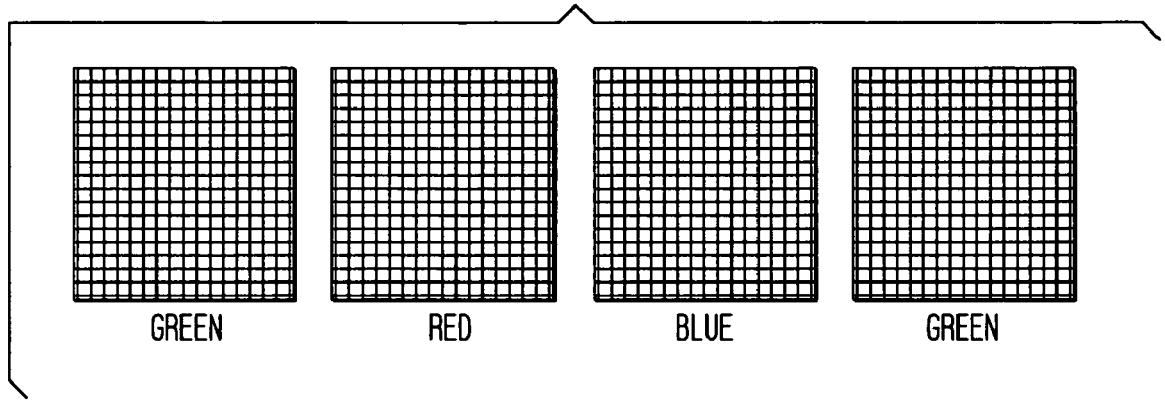
Figure 9D:
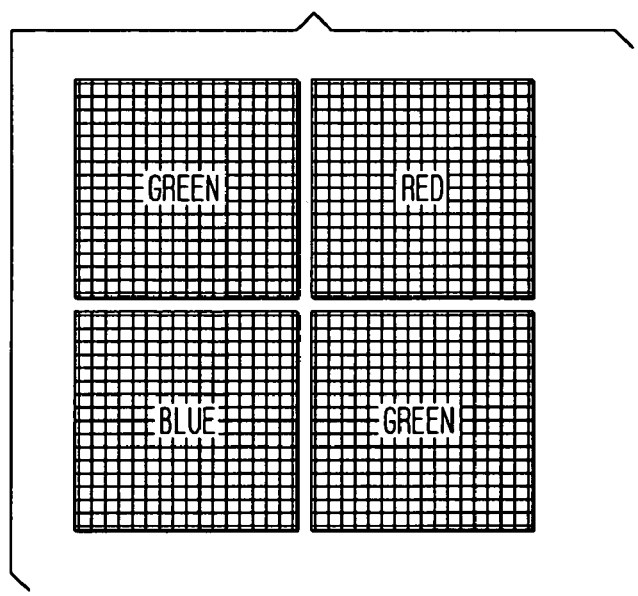

When a plurality of contiguous arrays is employed, there may be some parallax associated with their lenses. This causes the images on each array to be slightly shifted relative to each other. It is possible to compensate for this shift during image processing by maximizing the cross correlation function between the arrays. This compensation can also correct for temperature effects due to potentially unequal thermal expansion of the image sensors and lenses. Another way to reduce parallax is through the arrangement of the arrays. For example, when four arrays are used, they may be arranged in a two-by-two matrix (FIG. 9D) rather than in a linear manner (FIGS. 9B and 9C). As another example, when three arrays are used, they may be arranged in a triangle pattern.

Each object in the image can be shifted independently, depending on its distance from the camera. As an added benefit, the amount of shift can be recorded to provide information on object distance, e.g., for three-dimensional imaging. The required shift and thus distance can also be fed into an auto-focus system. This system may operate dynamically to track objects in motion for more responsive focusing. One of ordinary skill in the art upon routine experimentation should be able to come up with mechanism, software, and other items to take advantage of the parallax phenomenon associated with the invention.

Figure 11A:
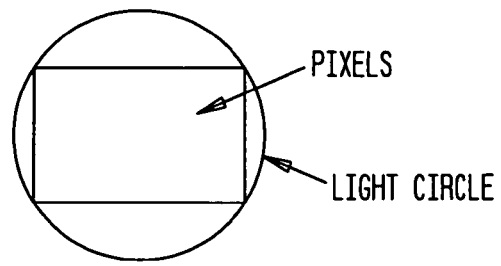
FIGS. 11A-11D, collectively referred to as FIG. 11, depict various techniques that may be used to address potential vignetting phenomenon problems associated with image sensors.

Vignetting is another potential issue that should be addressed for image sensor technologies. In general, vignetting occurs when an array of pixels receive attenuated light at its edges and/or corners relative to its center. This may occur when the array has an area greater than that of the light circle generated from focused incoming light. In order to avoid vignetting, the light focused on a pixel array should extend beyond the pixel array, as shown in FIG. 11A.

Figure 11B:
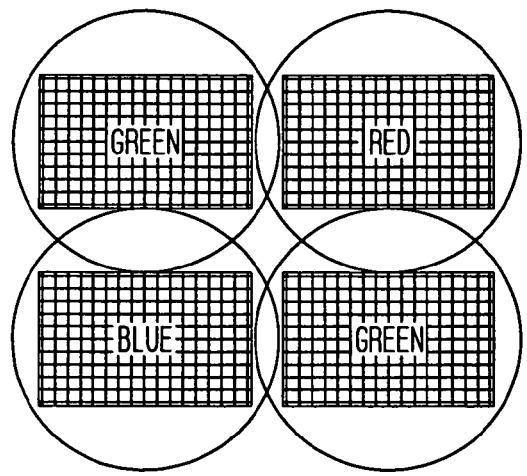
Figure 11C:
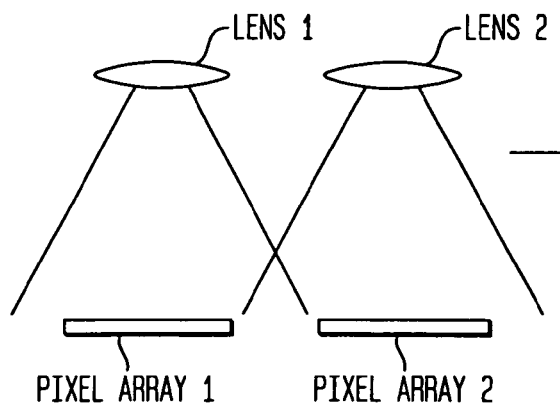
Figure 11D:
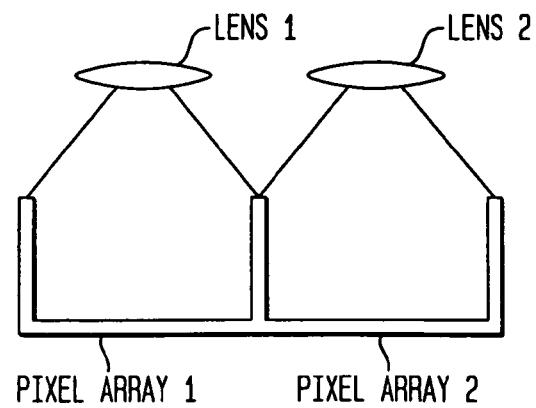

It should be noted, however, that when pixel arrays are placed next to each other, they, as shown in FIGS. 11B and 11C may be spaced apart to avoid cross talk from one lens' light circle overlapping another's photodetectors. The area between the pixel arrays can be used for readout electronics, etc. An alternative to spacing the arrays apart is to put absorptive vertical walls between the sensors as shown in FIG. 11D.

The invention also provide images sensor packages that may employ any of the image sensors described above. For example, the package may include a plurality of electrical contacts in electrical communication with the photodetectors. The contacts may be movable relative to the photodetectors, preferably in a sufficiently stress-relieving manner so as to maintain electrical communication with the photodetectors under repeated thermal cycling and other conditions. For example, the packaging technology described in U.S. Pat. No. 6,465,893 to Khandros et al. may be used with the invention.

Figure 12:
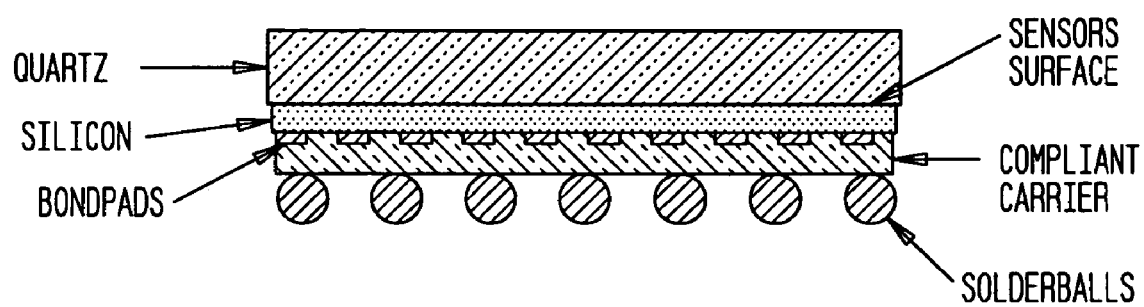
FIG. 12 depicts an exemplary image sensor package of the invention.

FIG. 12 depicts an exemplary image sensor package of the invention that employs the packaging technologies described in the '893 patent. The image sensor of FIG. 12 employs a rear-illuminated architecture that includes a quartz substrate on a silicon detector layer. Photodetectors in the detector layer are in electrical communication with the bond pads. In turn, the bond pads are in electrical communication with contacts in the form of solder balls.

Solder suitable for use with the invention may take any of a number of forms. Typically, balls or spheres are used. Pastes and other forms of solder may used as well. Regardless of the form of solder used, any various fusible alloys may be used. For example, eutectic solders containing tin and/or lead are known in the art. A flux may be advantageously used in conjunction with solder, since fluxless solder flow processes tend to be more costly. The flux may be present in the solder or in the passage. Optionally, a solder resist, typically an organic material, may be used to mask areas adjacent to the regions on which the solder may contact.

As shown, the sensor is placed on a compliant carrier, and the carrier is interposed between the sensor and the contacts in the form of solder balls. The compliant carrier allows the contacts to be movable relative to the photodetectors of the image sensor as well as other components of the image sensor. In addition, as evidenced by the package depicted in FIG. 12, a camera module vendor does not have to buy and support the wire-bonding machines used for chip-on-board (COB) mounting of the image sensor die. Instead, a sensor may be attached to a printed wiring board in the same manner as other electronic component of a camera or a mobile device, e.g., by reflowing the sensor and other electronic components to a printed wiring board.

Thus, the invention provides previously unknown advantages in the art of image sensor architecture leading to improved performances and/or reduction of cost. In general, the invention does not require the use of a transparent cover and a cavity such as those described in U.S. Published Patent Application No. 2005/0095835 and may be adapted to maximize the aperture ratio for an image sensor. As a result, sensor performance is improved by increasing the signal-to-noise ratio and low-light sensitivity. In addition, efficiency and low-light sensitivity may be improved. In some instances, the invention allows for the routing of conductive traces to be formed over instead of around pixels. As a result, the invention provides for a smaller and/or less costly chip than one made using a known architecture. Furthermore, the invention, in some instances, allows sensors to use nearly 100% of incoming light without filter loss. No cavity or cover are required In packaging embodiments, the invention enables a low cost, ultrahigh yield integrated package that may be less expensive to produce. Such a package is compatible with existing assembly infrastructure.

Variations of the present invention will be apparent to those of ordinary skill in the art in view of the disclosure contained herein. In general, the inventive image sensor may be constructed to contain or exclude specific feature according to the intended use of the sensor. That is, the inventive image sensor does not require the incorporation of all novel features of the invention. For example, when the invention is provided in the context of front-illuminated architecture, an optically transparent substrate may be used or omitted. In some instances, antireflective and other optical coatings may be provided. The coating may serve more than one function.

As another example, an alignment mechanism may be provided for aligning the components of the image sensors of the invention, e.g., the detectors, the filters, etc. In general, aligning mechanisms or apparatuses known in the art, e.g., mating features, clips, clamps, guides (mechanical, optical, electronic, or magnetic), devices used in metrology, etc., may be used to facilitate proper positioning of the elements of the invention. Optionally, a locking mechanism may be used as well. The locking mechanism may be the same as or different from the aligning mechanism. Additional variations of the invention may be discovered upon routine experimentation without departing from the spirit of the present invention.

It is to be understood that, while the invention has been described in conjunction with the preferred specific embodiments thereof, the foregoing description merely illustrates and does not limit the scope of the invention. Numerous alternatives and equivalents exist which do not depart from the invention set forth above. For example, any particular embodiment of the invention, e.g., those depicted in any drawing herein, may be modified to include or exclude features of other embodiments. Other aspects, advantages, and modifications within the scope of the invention will be apparent to those skilled in the art to which the invention pertains.

All patents and patent applications mentioned herein are hereby incorporated by reference in their entireties.

The invention claimed is:

1. An image sensor, comprising:
    an optically transparent substrate having a light-receiving surface and an opposing surface;
    photodetectors located at sites of first, second, and third arrays in a detector layer in contact with the opposing surface;
    the first m by n array including a plurality of contiguous photodetectors;
    the second p by q array including a plurality of contiguous photodetectors;
    the third r by s array including a plurality of contiguous photodetectors;
    wherein m, n, p, q, r and s denote the quantity of rows and columns, respectively, each of m, n, p, q, r and s being greater than or equal to 2; and
    one or more color filters positioned in a manner effective to allow for selective transmission of light of red, green, and blue wavelengths through the substrate to first, second, and third arrays, respectively.

2. The sensor of claim 1, wherein the substrate comprises an oxide material.

3. The sensor of claim 2, wherein the oxide material is selected from the group consisting of silicon oxides and aluminum oxides.

4. The sensor of claim 3, wherein the oxide material is a crystalline silicon oxide.

5. The sensor of claim 1, wherein the detector layer comprises a semiconductor material.

6. The sensor of claim 5, wherein the semiconductor material comprises Si.

7. The sensor of claim 1, wherein the photodetectors are arranged in contiguous first, second, and third arrays within the detector layer.

8. The sensor of claim 7, wherein the arrays are substantially coplanar relative to each other.

9. The sensor of claim 7, wherein the arrays are arranged in a triangle pattern.

10. The sensor of claim 1, wherein the photodetectors are located at sites of first, second, third, and fourth arrays in the detector layer.

11. The sensor of claim 10, wherein the arrays are arranged in a quadrilateral pattern.

12. The sensor of claim 1, wherein the photodetectors are located at sites of first, second, third, fourth, and fifth arrays in the detector layer.

13. The sensor of claim 12, wherein the arrays are arranged in a cross pattern.

14. The sensor of claim 1, wherein the arrays arranged in a linear pattern.

15. The sensor of claim 1, further comprising a fourth array of photodetectors, wherein the one or more color filters is positioned to allow for selective transmission of light of red, green, blue, and fourth wavelengths through the substrate to first, second, third, and fourth arrays, respectively.

16. The sensor of claim 15, wherein the fourth wavelength corresponds to white.

17. The sensor of claim 15, wherein the fourth wavelength is substantially equal to either the first, second, or the third wavelength.

18. The sensor of claim 17, wherein the fourth wavelength corresponds to green.

19. The sensor of claim 1, in the absence of any microlens.

20. A image sensor package, comprising:
    an optically transparent substrate having a light-receiving surface;
    a plurality of electrical contacts;
    a detector layer interposed between the electrical contact and the substrate;
    photodetectors located at sites of first, second, and third arrays in the detector layer;
    the first m by n array including a plurality of contiguous photodetectors;
    the second p by q array including a plurality of contiguous photodetectors;
    the third r by s array including a plurality of contiguous photodetectors;
    wherein m, n, p, q, r and s denote the quantity of rows and columns, respectively, each of in, n, p, q, r and s being greater than or equal to 2;
    one or more color filters positioned in a manner effective to allow for selective transmission of light of red, green, and blue wavelengths through the substrate to first, second, and third arrays, respectively; and
    wherein the electrical contacts are in electrical communication with the photodetectors, and movable relative to the photodetectors.

21. An image sensor, comprising:
    substantially coplanar first, second, and third contiguous arrays of photodetectors located in a detector layer;
    the first m by n array including a plurality of contiguous photodetectors;
    the second p by q array including a plurality of contiguous photodetectors;
    the third r by s array including a plurality of contiguous photodetectors;
    wherein m, n, p, q, r and s denote the quantity of rows and columns, respectively, each of m, n, p. q, r and s being greater than or equal to 2; and
    first, second, and third lenses positioned in a manner effective to direct transmission of light to the first, second, and third arrays of photodetectors, respectively.

22. An image sensor, comprising:
    a detector layer having a light-receiving surface;
    first, second, and third contiguous arrays of photodetectors located in the detector layer at increasing distances from the light-receiving surface;
    the first in by n array including a plurality of contiguous photodetectors;
    the second p by q array including a plurality of contiguous photodetectors;
    the third r by s array including a plurality of contiguous photodetectors;
    wherein m, n, p, q, r and s denote the quantity of rows and columns, respectively, each of m, n, p, q, r and s being greater than or equal to 2; and
    wherein at least a portion of each array does not overlap another.

23. The image sensor of claim 22, wherein no portion of each array overlaps another.

24. The image sensor of claim 23, wherein each contiguous array is placed in a manner effective to detect light of a different wavelength.

25. The image sensor of claim 22, wherein no pixel overlaps another.

* * * * *

UNITED STATES PATENT AND TRADEMARK OFFICE
CERTIFICATE OF CORRECTION

| | | |
|---|---|---|
| PATENT NO. | : 7,566,853 B2 | Page 1 of 1 |
| APPLICATION NO. | : 11/317207 | |
| DATED | : July 28, 2009 | |
| INVENTOR(S) | : David B. Tuckerman et al. | |

It is certified that error appears in the above-identified patent and that said Letters Patent is hereby corrected as shown below:

On the Title Page, at Item (74):
"Littenbur," should read --Littenberg,--.

Column 14, line 2, "in" should read --m--.

Column 14, line 31, "in" should read --m--.

Signed and Sealed this

Twenty-fourth Day of August, 2010

David J. Kappos
*Director of the United States Patent and Trademark Office*